US012652963B2

(12) United States Patent
Namba

(10) Patent No.: US 12,652,963 B2
(45) Date of Patent: Jun. 9, 2026

(54) SEMICONDUCTOR DEVICE WITH STORAGE ELEMENT

(71) Applicant: SONY SEMICONDUCTOR SOLUTIONS CORPORATION, Kanagawa (JP)

(72) Inventor: Yuji Namba, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 382 days.

(21) Appl. No.: 18/256,946

(22) PCT Filed: Dec. 9, 2021

(86) PCT No.: PCT/JP2021/045270
§ 371 (c)(1),
(2) Date: Jun. 12, 2023

(87) PCT Pub. No.: WO2022/131115
PCT Pub. Date: Jun. 23, 2022

(65) Prior Publication Data
US 2024/0040935 A1 Feb. 1, 2024

(30) Foreign Application Priority Data
Dec. 18, 2020 (JP) ................................. 2020-210475

(51) Int. Cl.
*H10N 50/80* (2023.01)
*H10B 61/00* (2023.01)
(Continued)

(52) U.S. Cl.
CPC ............. *H10N 50/80* (2023.02); *H10B 61/00* (2023.02); *H10N 50/01* (2023.02); *H10N 50/20* (2023.02)

(58) Field of Classification Search
CPC .... H10K 59/122; H10K 59/131; H10K 71/60; H10K 71/135; H10K 71/621
(Continued)

(56) References Cited

U.S. PATENT DOCUMENTS

| | | | | | |
|---|---|---|---|---|---|
| 4,206,471 A | * | 6/1980 | Hoffmann | .............. | H10B 12/30 257/920 |
| 4,208,670 A | * | 6/1980 | Hoffmann | .............. | H10B 12/30 257/296 |

(Continued)

FOREIGN PATENT DOCUMENTS

| | | |
|---|---|---|
| JP | 2003-243630 A | 8/2003 |
| JP | 2006-120707 A | 5/2006 |

(Continued)

OTHER PUBLICATIONS

International Search Report and Written Opinion of PCT Application No. PCT/JP2021/045270, issued on Mar. 1, 2022, 09 pages of ISRWO.

*Primary Examiner* — Jami Valentine Miller
(74) *Attorney, Agent, or Firm* — CHIP LAW GROUP

(57) ABSTRACT

A semiconductor device according to an embodiment of the present disclosure includes a storage element, an upper electrode, a lower electrode, a protective film, and a hydrogen adjustment region. The storage element is embedded in an insulating layer. The upper electrode connects the storage element and a first contact. The lower electrode is located on a side opposite to the upper electrode across the storage element to connect the storage element and a second contact. The protective film covers a peripheral surface of the laminated body including the storage element, the upper electrode, and the lower electrode except for a connection surface with the first contact and a connection surface with the second contact. The hydrogen adjustment region occludes hydrogen and is embedded in the insulating layer (Continued)

with an insulating film in the insulating layer interposed between the hydrogen adjustment region and the laminated body.

8 Claims, 8 Drawing Sheets

(51) Int. Cl.
H10N 50/01 (2023.01)
H10N 50/20 (2023.01)

(58) Field of Classification Search
USPC ........................................................ 257/421
See application file for complete search history.

(56) References Cited

U.S. PATENT DOCUMENTS

| | | | | |
|---|---|---|---|---|
| 6,501,119 | B1 * | 12/2002 | Ohno | H10B 12/0335 |
| | | | | 257/296 |
| 10,551,656 | B2 * | 2/2020 | Kim | G02F 1/133308 |
| 11,429,219 | B2 * | 8/2022 | Bae | G06F 3/0412 |
| 11,456,344 | B2 * | 9/2022 | Kim | H10K 59/122 |
| 11,817,049 | B2 * | 11/2023 | Ting | G09G 3/3208 |
| 2003/0164681 | A1 * | 9/2003 | Fukuoka | H10K 50/8426 |
| | | | | 313/512 |
| 2004/0137681 | A1 * | 7/2004 | Motoyoshi | H01F 10/3254 |
| | | | | 438/257 |
| 2005/0243541 | A1 * | 11/2005 | Sibbett | F21V 21/088 |
| | | | | 362/104 |
| 2005/0264473 | A1 * | 12/2005 | Sibbett | G09F 21/02 |
| | | | | 345/44 |
| 2006/0081961 | A1 * | 4/2006 | Tanaka | H10N 70/026 |
| | | | | 257/536 |
| 2007/0080905 | A1 * | 4/2007 | Takahara | G09G 3/3258 |
| | | | | 345/76 |
| 2011/0042735 | A1 * | 2/2011 | Ishigaki | H10B 20/25 |
| | | | | 257/E21.409 |
| 2014/0070162 | A1 * | 3/2014 | Iwayama | H10N 70/826 |
| | | | | 257/4 |
| 2020/0083448 | A1 * | 3/2020 | Cho | H10N 70/041 |
| 2020/0320959 | A1 * | 10/2020 | Ryu | G09G 3/3275 |
| 2021/0005670 | A1 * | 1/2021 | Cho | H10K 59/352 |
| 2021/0005681 | A1 * | 1/2021 | Chen | H10H 20/855 |
| 2021/0273002 | A1 * | 9/2021 | Shimizu | H10F 39/809 |
| 2021/0375199 | A1 * | 12/2021 | Ting | G09G 3/3208 |
| 2022/0102583 | A1 * | 3/2022 | Baumheinrich | G02B 6/12007 |
| 2022/0191994 | A1 * | 6/2022 | Huang | H05B 45/50 |
| 2022/0208880 | A1 * | 6/2022 | Kim | H10K 59/122 |
| 2022/0223664 | A1 * | 7/2022 | Kim | H10K 59/131 |
| 2023/0354648 | A1 * | 11/2023 | Kida | H10K 59/352 |
| 2024/0363623 | A1 * | 10/2024 | Kubouchi | H10D 12/481 |

FOREIGN PATENT DOCUMENTS

| | | |
|---|---|---|
| JP | 2012-014787 A | 1/2012 |
| JP | 2014-056941 A | 3/2014 |
| TW | 202034415 A | 9/2020 |

* cited by examiner

SEMICONDUCTOR DEVICE WITH STORAGE ELEMENT

CROSS REFERENCE TO RELATED APPLICATIONS

This application is a U.S. National Phase of International Patent Application No. PCT/JP2021/045270 filed on Dec. 9, 2021, which claims priority benefit of Japanese Patent Application No. JP 2020-210475 filed in the Japan Patent Office on Dec. 18, 2020. Each of the above-referenced applications is hereby incorporated herein by reference in its entirety.

FIELD

The present disclosure relates to a semiconductor device.

BACKGROUND

There is a method of forming a storage element having different characteristic for each memory cell block on the same substrate. For example, in a method described in Patent Literature 1, a material film of a storage element having a first characteristic is formed first in a region on a substrate where a first memory cell block is formed, and then the material film is patterned to form the storage element having the first characteristic.

Next, after the storage element formed is covered with an insulating mask, a material film of a storage element having a second characteristic is formed in a region on the substrate where a second memory cell block is formed, and the material film is patterned to form the storage element having the second characteristic.

As a result, the first memory cell block in which the storage element having the first characteristic is provided and the second memory cell block in which the storage element having the second characteristic is provided can be formed on the same substrate.

CITATION LIST

Patent Literature

Patent Literature 1: JP 2012-14787 A

SUMMARY

Technical Problem

However, in the above-described conventional technique, it is necessary to perform patterning a number of times equal to or more than the desired number of characteristics of the storage elements, and thus, a manufacturing cost increases.

Therefore, the present disclosure proposes a semiconductor device capable of reducing the manufacturing cost.

Solution to Problem

According to the present disclosure, a semiconductor device is provided. The semiconductor device according to an embodiment of the present disclosure includes a storage element, an upper electrode, a lower electrode, a protective film, and a hydrogen adjustment region. The storage element is embedded in an insulating layer. The upper electrode connects the storage element and a first contact. The lower electrode is located on a side opposite to the upper electrode across the storage element to connect the storage element and a second contact. The protective film covers a peripheral surface of the laminated body including the storage element, the upper electrode, and the lower electrode except for a connection surface with the first contact and a connection surface with the second contact. The hydrogen adjustment region occludes hydrogen and is embedded in the insulating layer with an insulating film in the insulating layer interposed between the hydrogen adjustment region and the laminated body.

DESCRIPTION OF EMBODIMENTS

Hereinafter, embodiments of the present disclosure are described in detail below with reference to the drawings. In each of the following embodiments, same parts are given the same reference signs to omit redundant description. In the following description, a plane direction of a flat surface on which a plurality of storage elements is provided is referred to as a horizontal direction, and a direction orthogonal to the flat surface on which the plurality of storage elements is provided is referred to as a vertical direction.

1. Sectional Structure of Semiconductor Device According to Embodiment

Figure 1:
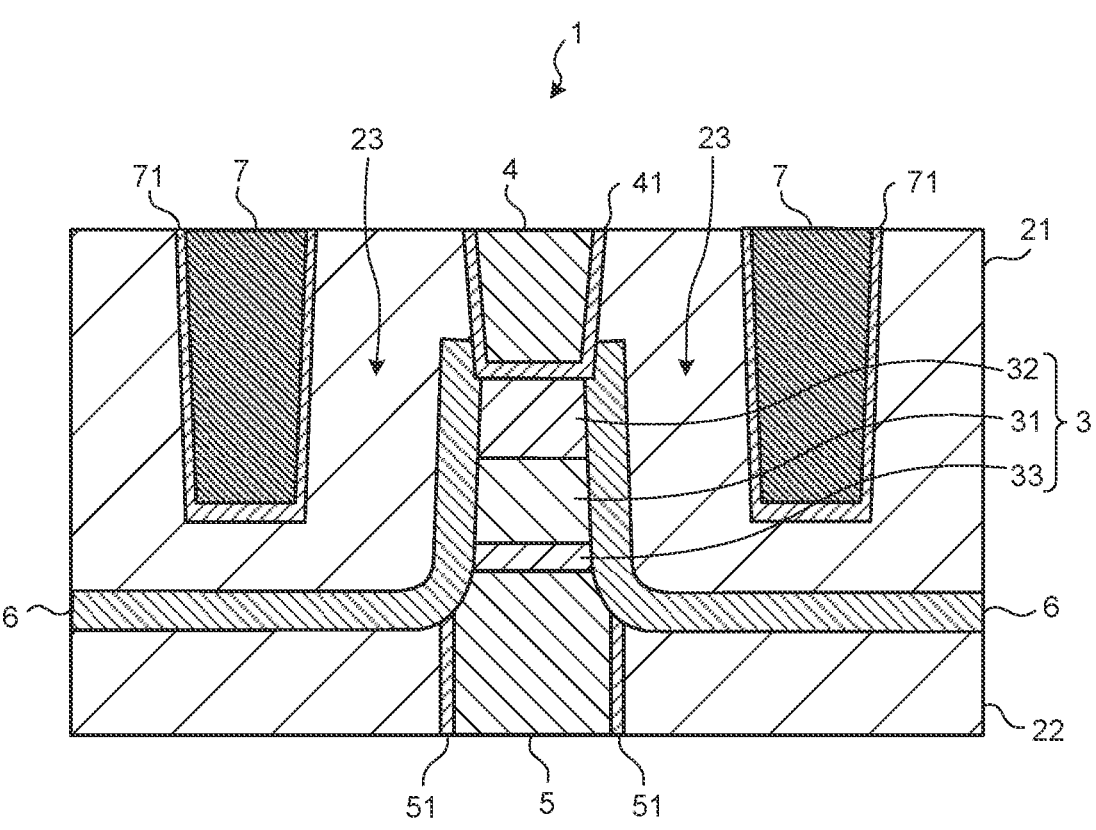
FIG. 1 is a longitudinal sectional view of a semiconductor device according to an embodiment.

FIG. 1 is a longitudinal sectional view of a semiconductor device according to an embodiment. As illustrated in FIG. 1, a semiconductor device 1 includes a storage element 31, an upper electrode 32, a lower electrode 33, and a protective film 6.

The storage element 31 is embedded in an insulating layer 21 such as a silicon oxide ($SiO_2$) layer. The upper electrode 32 connects the storage element 31 and a first contact 4. The upper electrode 32 is formed of, for example, a high conductive material containing one or more of titanium (Ti), titanium nitride (TiN), tantalum (Ta), tantalum nitride (TaN), tungsten (W), copper (Cu), and aluminum (Al).

The first contact 4 is formed of, for example, a high conductive material such as Cu, W, or Al. A side surface and a bottom surface of the first contact 4 are covered with a barrier metal 41. The barrier metal 41 is formed of, for example, simple substances of Ti and Ta or an alloy containing Ti and Ta.

The lower electrode 33 is located on a side opposite to the upper electrode 32 across the storage element 31, and connects the storage element 31 and a second contact 5. The lower electrode 33 is formed of, for example, a high conductive material containing one or more of Ti, TiN, Ta, TaN, W, Cu, and Al.

The second contact 5 is formed of, for example, a high conductive material such as Cu, W, or Al. A side surface of the second contact 5 is covered with a barrier metal 51. The barrier metal 51 is formed of, for example, simple substances of Ti and Ta or an alloy containing Ti and Ta.

The protective film 6 covers a peripheral surface of a laminated body 3, including the storage element 31, the upper electrode 32, and the lower electrode 33, except for a connection surface with the first contact 4 and a connection surface with the second contact 5. For example, the protective film 6 is made of SiN. For example, the protective film 6 prevents oxidation of the storage element 31. The protective film 6 extends between the insulating layer 21 in which the first contact 4 and the laminated body 3 are embedded and an insulating layer 22 in which the second contact 5 is embedded.

The storage element 31 is, for example, a spin torque-magnetic tunnel junction (ST-MTJ) element that reverses a magnetization direction of a storage layer to be described later by spin injection to store information.

Note that the storage element 31 is not limited to the ST-MTJ element, and may be, for example, a resistive random access memory (ReRAM), a phase change random access memory (PCRAM), or the like.

The storage element 31 has, for example, a lamination structure in which a base layer, a fixed magnetization layer, an insulating layer, a storage layer, and a cap layer are laminated in this order from a side closer to the second contact 5. Information is stored in the storage element 31 by changing the magnetization direction of the storage layer. The storage element 31 stores information of "0" or "1" according to a relative angle (parallel or antiparallel) between magnetization of the storage layer and magnetization of the fixed magnetization layer.

The base layer and the cap layer in the storage element 31 are formed of, for example, a metal film such as Ta or ruthenium (Ru) or a laminated film thereof. The fixed magnetization layer in the storage element 31 is a reference layer used as a reference of storage information (magnetization direction) in the storage layer.

The insulating layer in the storage element 31 is an intermediate layer serving as a tunnel barrier layer, and is formed of, for example, aluminum oxide ($Al_2O_3$) or magnesium oxide (MgO). The storage layer in the storage element 31 is formed of a ferromagnetic material having a magnetic moment in which the magnetization direction of the fixed magnetization layer freely changes in a direction perpendicular to a film surface. The storage layer is made of, for example, cobalt (Co)-iron (Fe)-boron (B).

In the semiconductor device 1, hydrogen gas generated in a manufacturing process may enter the storage element 31.

In the storage element 31, when an amount of hydrogen gas that has entered increases, an information holding power in the storage layer decreases in conjunction with the increase. Then, in the storage element 31, when the information holding power decreases, time during which the information can be held is shortened, but instead, the ease of writing the information is improved.

Here, since the storage element 31 having a large information holding power can store information for a long time, it is suitable, for example, for a storage memory. On the other hand, the storage element 31 having a small information holding power has a low voltage required for writing information and requires a short time for writing information. Thus, it is suitable for, for example, a cache memory.

Therefore, the semiconductor device 1 according to the embodiment has a configuration in which the storage elements 31 having different characteristics and applications can be formed on the same substrate by single patterning. Specifically, the semiconductor device 1 includes a hydrogen adjustment region 7. The hydrogen adjustment region 7 is embedded in the insulating layer 21 with an insulating film 23 in the insulating layer 21 interposed between the hydrogen adjustment region 7 and the laminated body 3 including the storage element 31, the upper electrode 32, and the lower electrode 33.

The hydrogen adjustment region 7 is formed of, for example, a metal having a hydrogen-storing function, such as Ti, zirconium (Zr), hafnium (Hf), vanadium (V), niobium (Nb), or Ta, or an alloy containing at least two or more of these metals having the hydrogen-storing function.

A side surface and a bottom surface of the hydrogen adjustment region 7 are covered with a barrier metal 71. The barrier metal 71 is formed of, for example, simple substances of Ti and Ta or an alloy containing Ti and Ta.

According to the semiconductor device 1, the hydrogen adjustment region 7 occludes hydrogen gas in the insulating layer 21 to suppress entry of the hydrogen gas into the storage element 31, so that a decrease in the information holding power of the storage layer can be suppressed.

In addition, for example, by providing the hydrogen adjustment region 7 having different volume for each memory block, the semiconductor device 1 can include the storage elements 31 having different information holding powers (characteristics) on the same substrate.

In a process of forming the hydrogen adjustment region 7, first, a photoresist is formed on the insulating layer 21, and the photoresist on a formation position of the hydrogen adjustment region 7 is removed by patterning using photolithography.

Then, using the photoresist as a mask, a hole is formed in the insulating layer 21 by, for example, reactive ion etching (RIE), and the barrier metal 71 is formed on an inner peripheral surface of the hole. Then, a metal having the hydrogen-storing function is embedded to form the hydrogen adjustment region 7.

Therefore, to manufacture the semiconductor device 1, for example, the storage elements 31 having different characteristics can be separately formed on the same substrate by single patterning by changing the size and depth of the hole for the hydrogen adjustment region 7 formed in the insulating layer 21 of each memory block.

As described above, in the semiconductor device 1, since the storage elements 31 having different characteristics can be separately formed on the same substrate by single patterning, the number of manufacturing steps is reduced as compared with a case of performing patterning a plurality of times. As a result, manufacturing cost can be reduced.

The hydrogen adjustment region 7 of the semiconductor device 1 is formed in a depth from a same layer as the layer provided with the first contact 4 in the insulating layer 21 to a layer provided with the laminated body 3 in the insulating layer 21.

The hydrogen adjustment region 7 may be provided only in the same layer as the layer provided with the first contact 4 in the insulating layer 21, or may be provided only in the same layer as the layer provided with the laminated body 3 in the insulating layer 21.

A portion located in the same layer as the layer provided with the first contact 4 in the hydrogen adjustment region 7 occludes, for example, hydrogen gas entering from a multilayer wiring layer formed above the insulating layer before the hydrogen gas enters the storage element 31. As a result, the hydrogen adjustment region 7 can suppress a change in the characteristics of the storage element 31 due to the hydrogen gas.

A portion located in the same layer as the layer in which the laminated body 3 is provided in the hydrogen adjustment region 7 occludes the hydrogen gas present at a position closest to the storage element 31 in the insulating layer 21, so that a change in characteristics of the storage element 31 due to the hydrogen gas can be suppressed.

2. Sectional Structure of Semiconductor Device According to First Modification

Figure 2:
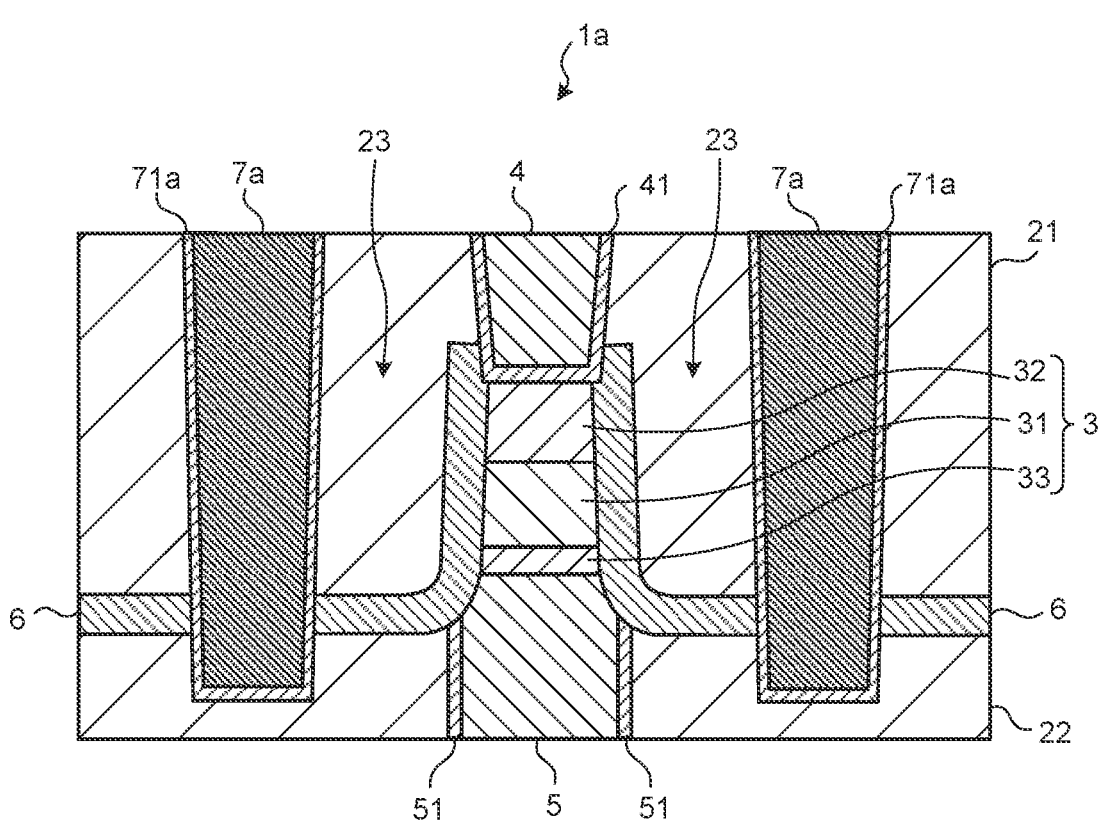
FIG. 2 is a longitudinal sectional view of a semiconductor device according to a first modification of the embodiment.

Next, a semiconductor device 1a according to a first modification will be described with reference to FIG. 2. FIG. 2 is a longitudinal sectional view of the semiconductor device according to the first modification of the embodiment.

As illustrated in FIG. 2, in the semiconductor device 1a according to the first modification, a depth of a hydrogen adjustment region 7a is different from that of the hydrogen adjustment region 7 illustrated in FIG. 1. The hydrogen adjustment region 7a is formed in a depth from the same layer as the layer in which the first contact 4 is provided in the insulating layer 21 to a same layer as the layer in which the second contact 5 is provided in the insulating layer 22. A barrier metal 71a is also provided on a side surface and a bottom surface of the hydrogen adjustment region 7a.

The hydrogen adjustment region 7a illustrated in FIG. 2 has a larger volume than the hydrogen adjustment region 7 illustrated in FIG. 1, and also has a larger hydrogen gas storage amount. Therefore, by adopting the hydrogen adjustment region 7 illustrated in FIG. 1 in the first memory cell block and adopting the hydrogen adjustment region 7a illustrated in FIG. 2 in the formation region of the second memory cell block on the same substrate, memory cell blocks having different information holding powers can be provided on the same substrate.

The hydrogen adjustment region 7a penetrates a portion of the protective film 6 between the insulating layer 21 and insulating layer 21. Therefore, the hydrogen adjustment region 7a can be formed by single patterning in the same layer as the layer in which the first contact 4 is provided in the insulating layer 21, the same layer as the layer in which the laminated body 3 is provided, and the same layer as the layer in which the second contact 5 is provided in the insulating layer 22.

3. Sectional Structure of Semiconductor Device According to Second Modification

Figure 3:
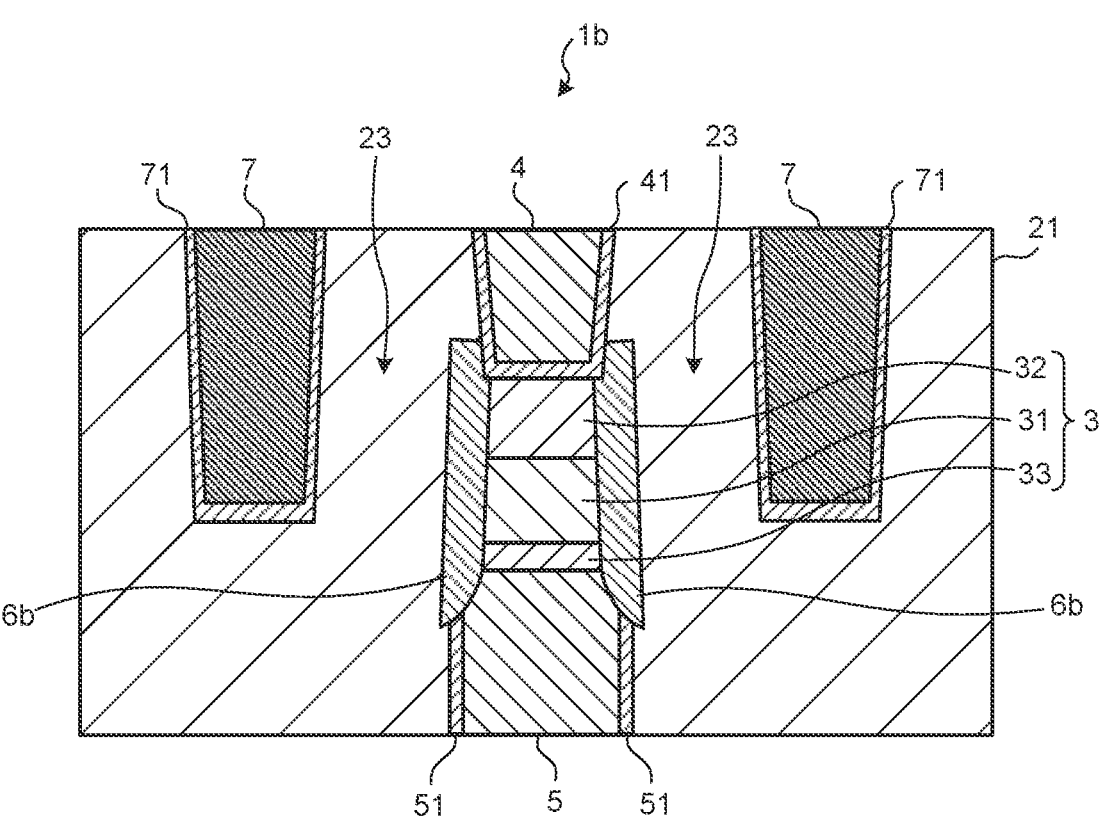
FIG. 3 is a longitudinal sectional view of a semiconductor device according to a second modification of the embodiment.

Next, a semiconductor device 1b according to a second modification will be described with reference to FIG. 3. FIG. 3 is a longitudinal sectional view of a semiconductor device according to the second modification of the embodiment.

As illustrated in FIG. 3, a protective film 6b of the semiconductor device 1b according to the second modification is provided on a peripheral surface of the laminated body 3 excluding the connection surface with the first contact 4 and the connection surface with the second contact 5, and does not extend between the insulating layers 21 and 22 illustrated in FIG. 1.

As described above, depending on a processing method, the semiconductor device 1b in which the protective film 6 does not exist between the insulating layers 21 and 22 is also available. Also in the above semiconductor device 1b, by providing the hydrogen adjustment region 7, it is possible to arrange the storage elements 31 having different characteristics on the same substrate by single patterning.

4. Sectional Structure of Semiconductor Device According to Third Modification

Figure 4:
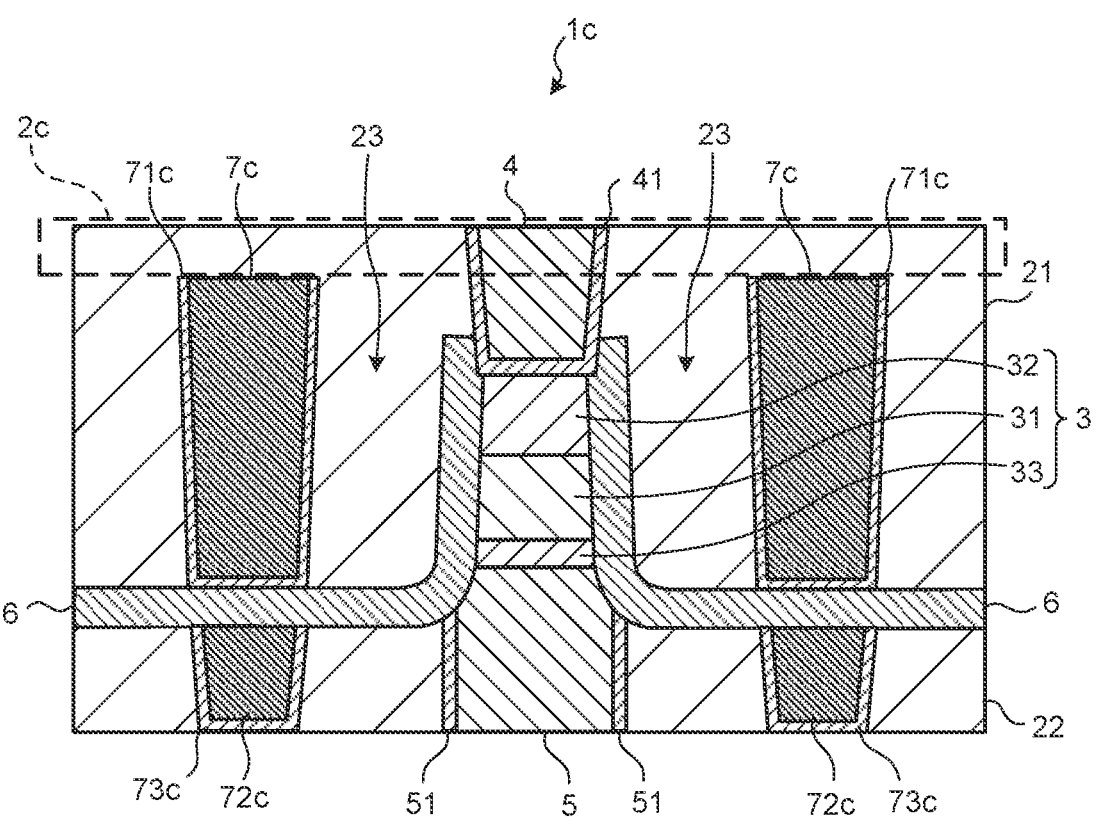
FIG. 4 is a longitudinal sectional view of a semiconductor device according to a third modification of the embodiment.

Next, a semiconductor device 1c according to a third modification will be described with reference to FIG. 4. FIG. 4 is a longitudinal sectional view of a semiconductor device according to the fourth modification of the embodiment.

As illustrated in FIG. 4, the semiconductor device 1c includes a hydrogen adjustment region 7c extending from the same layer as the layer provided with the first contact 4 in the insulating layer 21 to a portion of the protective film 6 between the insulating layers 21 and 22. A barrier metal 71c is provided on a side surface and a bottom surface of the hydrogen adjustment region 7c. An interlayer insulating film 2c is formed on the hydrogen adjustment region 7c.

The semiconductor device 1c also includes a hydrogen adjustment region 72c in the same layer as the layer in which the second contact 5 is provided. A barrier metal 73c is provided on a side surface and a bottom surface of the hydrogen adjustment region 72c. The hydrogen adjustment region 72c occludes the hydrogen gas that passes through the insulating layer 21 and diffuses to the lower insulating layer 22, so that a change in characteristics of the storage element 31 due to the hydrogen gas can be suppressed.

When the semiconductor device 1c illustrated in FIG. 4 is manufactured, first, the barrier metals 51 and 73c, the second contact 5, and the hydrogen adjustment region 72c are formed in the lower insulating layer 22. Next, the lower electrode 33, the storage element 31, the upper electrode 32, and the protective film 6 are sequentially formed.

Then, after the upper insulating layer 21 is formed, the barrier metal 71c and the hydrogen adjustment region 7c are formed. Then, after the interlayer insulating film 2c is further formed on the insulating layer 21, the barrier metal 41 and the first contact 4 are formed.

In this way, since the hydrogen adjustment region 7c is formed first, and the first contact 4 is formed after an upper surface of the hydrogen adjustment region 7c is covered with the interlayer insulating film 2c, it is possible to prevent metal in the hydrogen adjustment region 7c from being contaminated at the time of forming the first contact 4.

Further, in the semiconductor device 1c, patterning for forming the hydrogen adjustment region 72c and patterning for forming the hydrogen adjustment region 7c are required, but volumes of the hydrogen adjustment regions 72c and 7c can be finely adjusted in two times of patterning.

For example, when a volume of the hydrogen adjustment region 72c formed first varies, a varying volume of the hydrogen adjustment region 72c is canceled by the hydrogen adjustment region 7c formed later by patterning. As a result, a total volume of the hydrogen adjustment regions 7c and 72c disposed vertically can be made uniform.

5. Arrangement of Hydrogen Adjustment Region According to Embodiment

Figure 5:
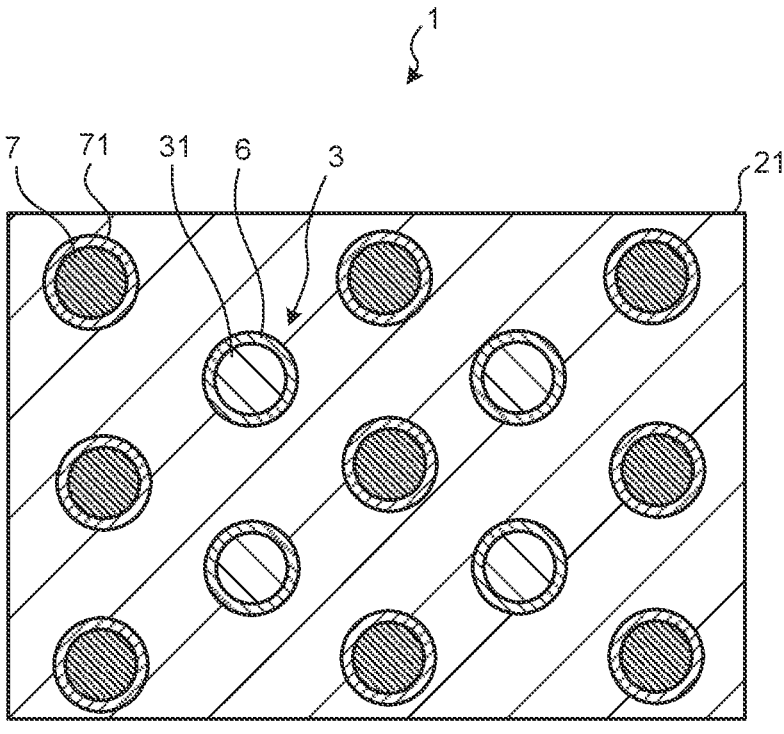
FIG. 5 is a transverse sectional view of the semiconductor device according to the embodiment.

Next, an arrangement of the hydrogen adjustment region 7 will be described with reference to FIG. 5. FIG. 5 is a transverse sectional view of the semiconductor device according to the embodiment. FIG. 5 schematically illustrates a cut surface obtained by cutting the semiconductor device 1 illustrated in FIG. 1 along a plane on which the storage element 31 is disposed.

As illustrated in FIG. 5, the semiconductor device 1 includes a plurality of storage elements 31 on the same substrate. Storage elements 31 are formed to have an equal cross section area, an equal depth in the vertical direction, and the same volume.

The hydrogen adjustment region 7 is provided between adjacent storage elements 31. Each hydrogen adjustment region 7 is provided, for example, at four corners surrounding each storage element 31. In the region illustrated in FIG. 5, the hydrogen adjustment regions 7 are formed to have an equal cross section area, an equal depth in the vertical direction, and the same volume. The hydrogen adjustment regions 7 are arranged such that the distances to the nearest storage element 31 are all equal. As a result, in the semiconductor device 1, the information holding power by each storage element 31 becomes uniform.

Figure 6:
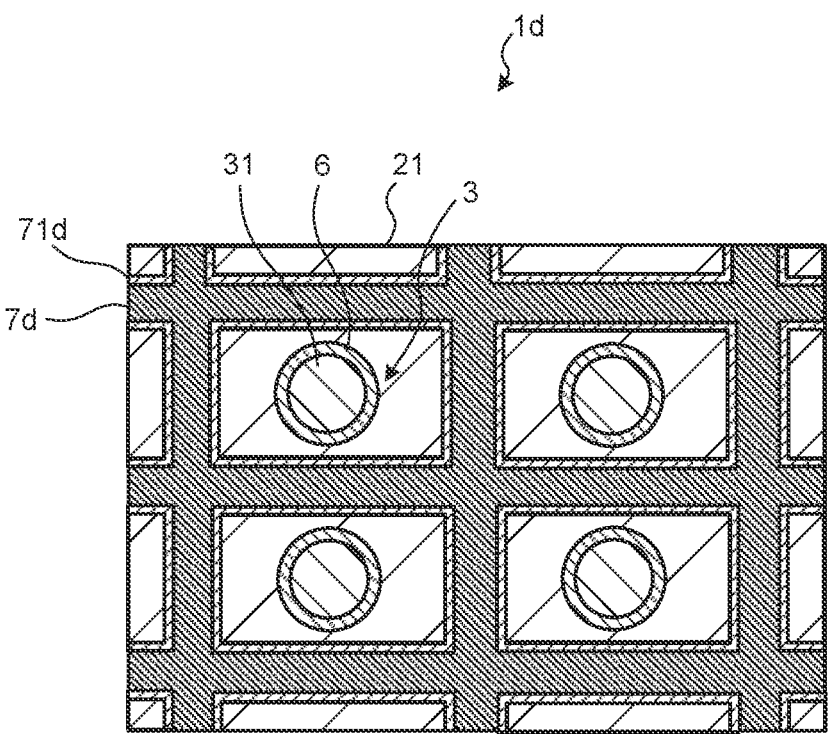
FIG. 6 is a transverse sectional view of a semiconductor device according to a fourth modification of the embodiment.

6. Arrangement of Hydrogen Adjustment Region of Semiconductor Device According to Fourth Modification Next, an arrangement of a hydrogen adjustment regions 7d of a semiconductor device 1d according to a fourth modification will be described with reference to FIG. 6. FIG. 6 is a transverse sectional view of a semiconductor device according to the fourth modification of the embodiment. FIG. 6 schematically illustrates a cut surface obtained by cutting the semiconductor device 1d along a plane on which the storage element 31 is disposed.

As illustrated in FIG. 6, the hydrogen adjustment region 7d is formed in, for example, a lattice shape in a transverse sectional view. A barrier metal 71d is provided between the hydrogen adjustment region 7d and the insulating layer 21. Each storage element 31 is provided at a position surrounded by the lattice of the hydrogen adjustment region 7d. In this manner, the hydrogen adjustment region 7d is provided so as to surround an entire periphery of the storage element 31 in a plane orthogonal to a direction from the first contact 4 to the second contact 5.

As a result, the hydrogen adjustment region 7d can occlude a larger amount of hydrogen gas from the insulating layer 21 around each storage element 31 than the hydrogen adjustment region 7 illustrated in FIG. 5. Therefore, the semiconductor device 1d can include the storage element 31 having a larger information holding power than that of the semiconductor device 1 illustrated in FIG. 5.

Figure 7:
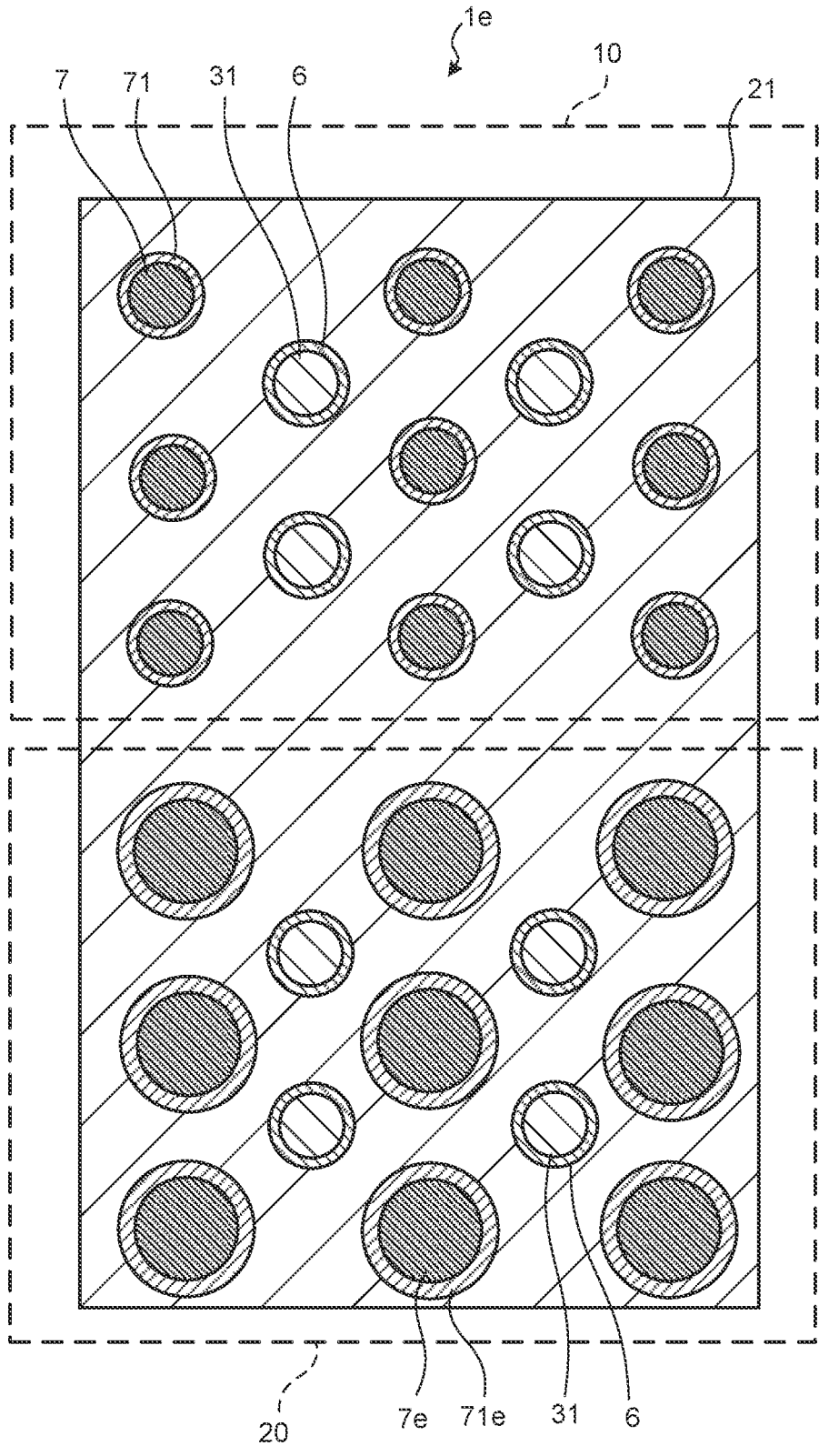
FIG. 7 is a transverse sectional view of a semiconductor device according to a fifth modification of the embodiment.

7. Arrangement of Hydrogen Adjustment Region of Semiconductor Device According to Fifth Modification Next, an arrangement of the hydrogen adjustment region 7 and a hydrogen adjustment region 7e of a semiconductor device 1e according to a fifth modification will be described with reference to FIG. 7. FIG. 7 is a transverse sectional view of a semiconductor device according to the fourth modification of the embodiment. FIG. 7 schematically illustrates a cut surface obtained by cutting the semiconductor device 1e along a plane on which the storage element 31 is disposed.

As illustrated in FIG. 7, the semiconductor device 1e includes a first region 10 in which a first cell block is provided and a second region 20 in which a second cell block is provided on the same substrate. A plurality of storage elements 31 is provided in each of the first region 10 and the second region 20.

Storage elements 31 are formed to have an equal cross section area, an equal depth in the vertical direction, and the same volume. In the first region 10, the hydrogen adjustment region 7 having the same shape as the hydrogen adjustment region 7 illustrated in FIG. 5 is provided in the same arrangement as the arrangement illustrated in FIG. 5.

On the other hand, in the second region 20, the hydrogen adjustment region 7e having a larger cross section area than that provided in the first region 10 and having a depth equal to or larger than that provided in the first region 10 is provided.

The hydrogen adjustment regions 7e are provided, for example, at four corners surrounding each storage element 31, and are arranged such that the distances to the nearest storage element 31 are all equal. A barrier metal 71e is provided between the hydrogen adjustment region 7e and the insulating layer 21.

The hydrogen adjustment region 7e in the second region 20 is larger in volume than the hydrogen adjustment region 7 in the first region 10. Therefore, the hydrogen adjustment region 7e of the second region 20 can occlude a larger amount of hydrogen gas from the insulating layer 21 around each storage element 31 than the hydrogen adjustment region 7 of the first region 10. Therefore, the storage element 31 in the second region 20 has a larger information holding power than the storage element 31 in the first region 10.

As described above, the semiconductor device 1e includes the storage element 31 having a relatively small information holding power in the first region 10, and includes the storage element 31 having a relatively large information holding power in the second region 20. According to the fifth modification, by providing different volumes to the hydrogen adjustment regions 7 and 7e formed in the first region 10 and the second region 20 by single patterning, it is possible to separately form the storage elements 31 having different characteristics on the same substrate.

8. Semiconductor Device Manufacturing Process

Figure 8:
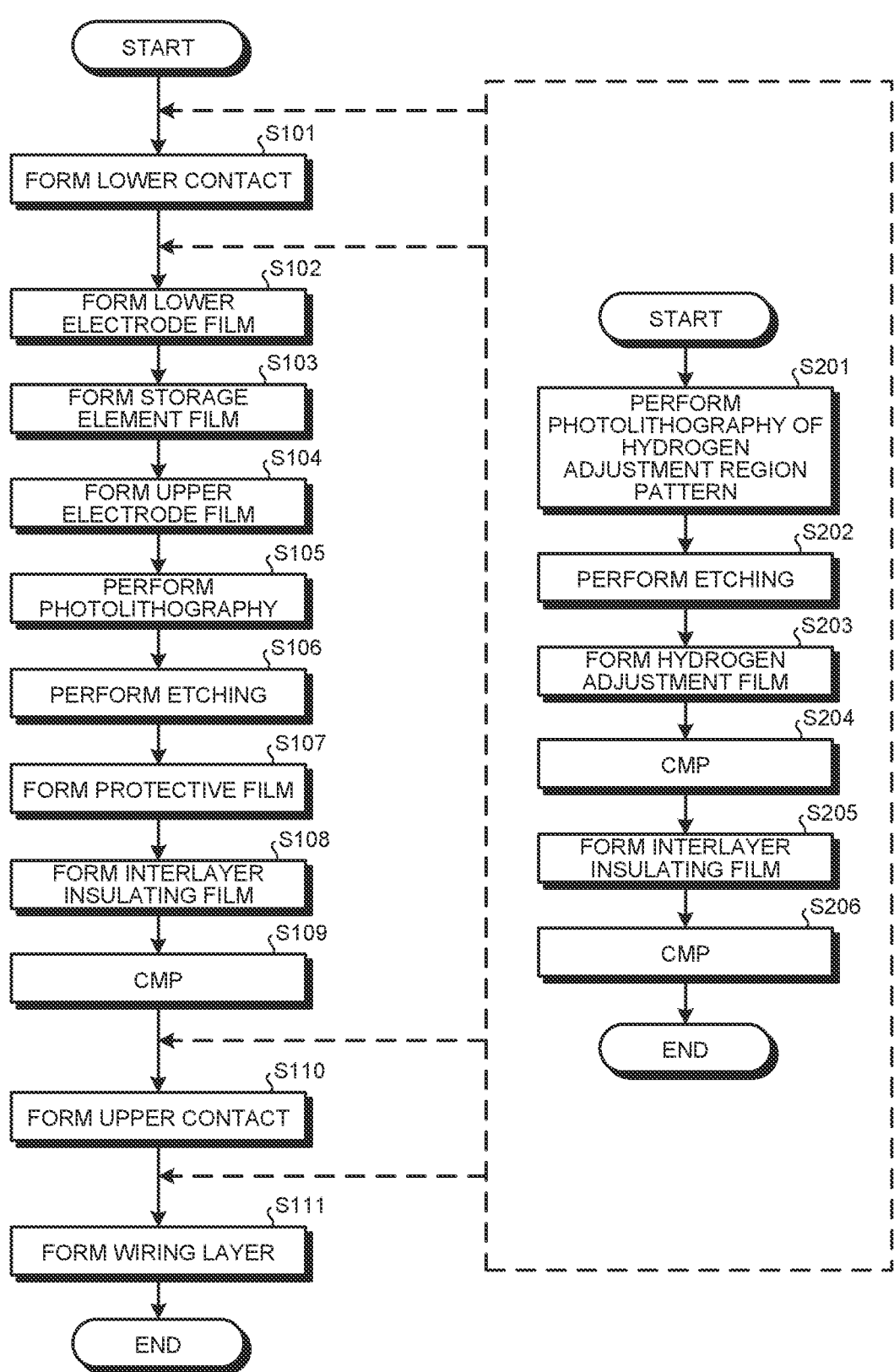
FIG. 8 is a flowchart illustrating a manufacturing process of the semiconductor device according to the embodiment of the present disclosure.

Next, a manufacturing process of the semiconductor device 1 according to the embodiment will be described with reference to FIG. 8. FIG. 8 is a flowchart illustrating the manufacturing process of the semiconductor device according to the embodiment of the present disclosure.

A left column of FIG. 8 illustrates the manufacturing process of the semiconductor device including a general storage element. A right column of FIG. 8 illustrates the manufacturing process of the hydrogen adjustment regions 7, 7a, 7c, 72c, 7d, and 7e according to the embodiment.

For example, when the semiconductor device including the storage element 31 is manufactured, the second contact 5 is first formed in the lower insulating layer 22 (Step S101). At this time, a photoresist is formed on the insulating layer 22, and the photoresist at a position of forming the second contact 5 is removed by photolithography.

Next, RIE is performed using remaining photoresist as a mask to form a hole for the second contact 5 in the insulating layer 22. The barrier metal 51 is formed on an inner peripheral surface of the hole by sputtering, for example, and then a metal that will be a material of the second contact 5 is embedded in the hole. A metal film deposited on the insulating layer 22 is removed by chemical mechanical polishing (CMP), for example, to form the second contact 5.

Subsequently, a lower electrode film is formed on the insulating layer 22 (Step S102), a storage element film is formed (Step S103), and an upper electrode film is formed (Step S104). Next, for example, a hard mask layer for selectively forming the laminated body 3 is formed, and a photoresist is patterned on the second contact 5 by photolithography (Step S105).

Subsequently, a hard mask is formed, and unnecessary portions of the upper electrode film, the storage element film, and the lower electrode film are removed by etching using patterned photoresist as a mask (Step S106). As a result, the laminated body 3 in which the lower electrode 33, the storage element 31, and the upper electrode 32 are sequentially laminated is formed on the second contact 5.

Subsequently, the protective film 6 is formed so as to cover the insulating layer 22 and the laminated body 3 (Step S107). Subsequently, an interlayer insulating film is formed (Step S108) to form the upper insulating layer 21. Then, an upper surface of the insulating layer 21 is planarized by, for example, CMP (Step S109).

Subsequently, the first contact 4 is formed (Step S110). At this time, a photoresist is formed on the insulating layer 21, and the photoresist at the position for forming the first contact 4 is removed by photolithography.

Next, RIE is performed using remaining photoresist as a mask to form a hole for the first contact 4 that reaches the upper electrode 32 in the insulating layer 21. The barrier metal 41 is formed on the inner peripheral surface of the hole by sputtering, for example, and then a metal that will be a material of the first contact 4 is embedded in the hole. The metal film deposited on the insulating layer 21 is removed by CMP, for example, to form the first contact 4.

Then, the wiring layer is formed in and on the insulating layer 21 (Step S111) to complete the semiconductor device including the storage element 31. When the hydrogen adjustment region 7, 7a, 7c, 72c, 7d, or 7e is provided in the semiconductor device, a process of Steps S201 to S206 is added in the middle of the above-described manufacturing process.

As illustrated in FIG. 8, when the hydrogen adjustment region 7, 7a, 7c, 72c, 7d, or 7e is formed, photolithography of a hydrogen adjustment region pattern is first performed (Step S201). Here, a photoresist is formed on the upper surface of the insulating layer 21 or the insulating layer 22, and the photoresist at a position for forming the hydrogen adjustment region 7, 7a, 7c, 72c, 7d, or 7e is removed by photolithography.

Subsequently, etching is performed using remaining photoresist as a mask to form a hole for forming the hydrogen adjustment region 7, 7a, 7c, 72c, 7d, or 7e in the insulating layer 21 or the insulating layer 22 (Step S202).

Then, the inner peripheral surface of the hole formed is covered with the barrier metal 71, 71a, 71c, 71d, or 71e, and then the hydrogen adjustment film is formed (Step S203). At this point, the hole is filled with the hydrogen adjustment film, and the hydrogen adjustment region 7, 7a, 7c, 72c, 7d, or 7e is formed in the insulating layer 21 or the insulating layer 22.

Subsequently, CMP is performed on the hydrogen adjustment film to expose the upper surface of the insulating layer 21 or the insulating layer 22 (Step S204). Then, an interlayer insulating film is formed on the insulating layer 21 or the insulating layer 22 and on the hydrogen adjustment region 7, 7a, 7c, 72c, 7d, or 7e (Step S205).

Lastly, CMP is performed on the upper surface of the insulating layer 21 or the insulating layer 22 (Step S206), and the upper surface of the insulating layer 21 or the insulating layer 22 is planarized to complete the process of forming the hydrogen adjustment region 7, 7a, 7c, 72c, 7d, or 7e. Note that S205 and S206 are performed as appropriate when there is a concern about exposure of the hydrogen adjustment film to the wafer surface.

Here, for example, when the hydrogen adjustment region 72c is formed in the same layer as the layer in which second contact 5 is provided (see the drawing), Steps S201 to 204 and Steps S205 to S206 as necessary are inserted before Step S101 or between Step S101 and Step S102.

In addition, for example, when the hydrogen adjustment region 7, 7c, 7d, or 7e is formed in the same layer as the layer in which the first contact 4 is provided and the same layer as the layer in which the laminated body 3 is provided, Steps S201 to 204 and Steps S205 to S206 as necessary are inserted between Step S109 and Step S110 or between Step S110 and Step S111. In addition, also when the hydrogen adjustment region 7a extending from the layer provided with the first contact 4 to the layer provided with the second contact 5 is formed, Steps S201 to 204 and S205 to S206 as necessary are inserted between Step S109 and Step S110 or between Step S110 and Step S111.

9. Effects

The semiconductor device 1 includes the storage element 31, the upper electrode 32, the lower electrode 33, the protective film 6, and the hydrogen adjustment region 7. The storage element 31 is embedded in the insulating layer 21. The upper electrode 32 connects the storage element 31 and a first contact 4. The lower electrode 33 is located on a side opposite to the upper electrode 32 across the storage element 31, and connects the storage element 31 and a second contact 5. The protective film 6 covers a peripheral surface of a laminated body 3, including the storage element 31, the upper electrode 32, and the lower electrode 33, except for a connection surface with the first contact 4 and a connection surface with the second contact 5. The hydrogen adjustment region 7 is embedded in the insulating layer 21 with the insulating film 23 in the insulating layer 21 interposed between the hydrogen adjustment region 7 and the laminated body 3, and occludes hydrogen. Thus, the plurality of hydrogen adjustment regions 7 having different volumes can be formed by single patterning in the semiconductor device 1. As a result, the manufacturing cost can be reduced.

The hydrogen adjustment region 7 is provided in the same layer as the layer in which the first contact 4 is provided in the insulating layer 21. The hydrogen adjustment region 7 occludes hydrogen gas entering from the multilayer wiring layer formed above the insulating layer 21 before entering the storage element 31. As a result, the hydrogen adjustment region 7 can suppress a change in the characteristics of the storage element 31 due to the hydrogen gas.

The hydrogen adjustment region 7 is provided in the same layer as the layer in which the laminated body 3 is provided in the insulating layer 21. As a result, the hydrogen adjustment region 7 occludes the hydrogen gas present at the position closest to the storage element 31 in the insulating layer 21, whereby the change in the characteristics of the storage element 31 due to the hydrogen gas can be suppressed.

The hydrogen adjustment region 72c is provided in the same layer as the layer in which second contact 5 is provided in the insulating layer 22. As a result, the hydrogen adjustment region 72c occludes the hydrogen gas diffusing into the lower insulating layer 22, whereby the change in the characteristics of the storage element 31 due to the hydrogen gas can be suppressed.

The protective film 6 extends between the insulating layer 21 in which the first contact 4 and the laminated body 3 are embedded and the insulating layer 22 in which the second contact 5 is embedded. The hydrogen adjustment region 7a penetrates a portion of the protective film 6 between insulating layers. The hydrogen adjustment region 7a can be formed by single patterning in the same layer as the layer in which the first contact 4 is provided in the insulating layer 21, the same layer as the layer in which laminated body 3 is provided, and the same layer as the layer in which second contact 5 is provided in the insulating layer 22.

The hydrogen adjustment region 7 is provided between adjacent storage elements 31. As a result, in the semiconductor device 1, the information holding power by each storage element 31 becomes uniform.

The hydrogen adjustment region 7d is provided so as to surround an entire periphery of the storage element 31 in a plane orthogonal to the direction from the first contact 4 to the second contact 5. As a result, the hydrogen adjustment region 7*d* can occlude a larger amount of hydrogen gas from the insulating layer 21 around each storage element 31 than the hydrogen adjustment region 7 illustrated in FIG. 5. Therefore, the semiconductor device 1*d* can include the storage element 31 having a larger information holding power than that of the semiconductor device 1 illustrated in FIG. 5.

The volumes of the hydrogen adjustment regions 7 and 7*e* are different between the first region 10 in which the plurality of storage elements 31 is provided and the second region 20 in which the plurality of storage elements 31 is provided. As a result, in the semiconductor device 1*e*, the storage elements 31 having different characteristics can be separately formed on the same substrate.

Note that the effects described in the present specification are merely examples and not limited, and other effects may be provided.

The present technology can also have the following configurations.

(1)
A semiconductor device including:
a storage element embedded in an insulating layer;
an upper electrode that connects the storage element and a first contact;
a lower electrode located on a side opposite to the upper electrode across the storage element, the lower electrode connecting the storage element and a second contact;
a protective film covering a peripheral surface of a laminated body including the storage element, the upper electrode, and the lower electrode, the peripheral surface excluding a connection surface with the first contact and a connection surface with the second contact; and
a hydrogen adjustment region that occludes hydrogen, the hydrogen adjustment region being embedded in the insulating layer with an insulating film in the insulating layer interposed between the hydrogen adjustment region and the laminated body.

(2)
The semiconductor device according to (1), wherein the hydrogen adjustment region is provided in a same layer as a layer in which the first contact is provided in the insulating layer.

(3)
The semiconductor device according to (1) or (2), wherein the hydrogen adjustment region is provided in a same layer as a layer in which the laminated body is provided in the insulating layer.

(4)
The semiconductor device according to any one of (1) to (3), wherein the hydrogen adjustment region is provided in a same layer as a layer in which the second contact is provided in the insulating layer.

(5)
The semiconductor device according to any one of (1) to (4), wherein the protective film extends between an insulating layer in which the first contact and the laminated body are embedded and an insulating layer in which the second contact is embedded, and the hydrogen adjustment region penetrates a portion of the protective film between the insulating layers.

(6)
The semiconductor device according to any one of (1) to (5), wherein the hydrogen adjustment region is provided between a plurality of the storage elements adjacent to each other.

(7)
The semiconductor device according to any one of (1) to (6), wherein the hydrogen adjustment region is provided to surround an entire periphery of the storage element in a plane orthogonal to a direction from the first contact to the second contact.

(8)
The semiconductor device according to any one of (1) to (7), wherein a volume of the hydrogen adjustment region is different between a first region in which a plurality of the storage elements is provided and a second region in which a plurality of the storage elements is provided.

REFERENCE SIGNS LIST

1, 1*a*, 1*b*, 1*c*, 1*d*, 1*e* SEMICONDUCTOR DEVICE
21, 22 INSULATING LAYER
23 INSULATING FILM
3 LAMINATED BODY
31 STORAGE ELEMENT
32 UPPER ELECTRODE
33 LOWER ELECTRODE
4 FIRST CONTACT
5 SECOND CONTACT
6, 6*b* PROTECTIVE FILM
7, 7*a*, 7*c*, 72*c*, 7*d*, 7*e* HYDROGEN ADJUSTMENT REGION
41, 51, 71, 71*a*, 71*c*, 73*c*, 71*d*, 71*e* BARRIER METAL

The invention claimed is:
1. A semiconductor device, comprising:
a first insulating layer;
a storage element embedded in the first insulating layer;
an upper electrode on a first side of the storage element, wherein the upper electrode connects the storage element and a first contact;
a lower electrode on a second side of the storage element, wherein
the first side of the storage element is opposite to the second side of the storage element, and
the lower electrode connects the storage element and a second contact;
a protective film that covers a peripheral surface of a laminated body, wherein
the laminated body includes the storage element, the upper electrode, and the lower electrode, and
the peripheral surface excludes a connection surface with the first contact and a connection surface with the second contact; and
a hydrogen adjustment region that occludes hydrogen, wherein
the hydrogen adjustment region is embedded in the first insulating layer with an insulating film, in the first insulating layer, between the hydrogen adjustment region and the laminated body.

2. The semiconductor device according to claim 1, wherein the hydrogen adjustment region is in a same layer as a layer in which the first contact is in the first insulating layer.

3. The semiconductor device according to claim 1, wherein the hydrogen adjustment region is in a same layer as a layer in which the laminated body is in the first insulating layer.

4. The semiconductor device according to claim 1, wherein the hydrogen adjustment region is in a same layer as a layer in which the second contact is in the first insulating layer.

5. The semiconductor device according to claim 1, further comprising a second insulating layer, wherein the protective film extends between the first insulating layer in which the first contact and the laminated body are embedded, and the second insulating layer in which the second contact is embedded, and the hydrogen adjustment region penetrates a portion, of the protective film, between the first insulating layer and the second insulating layer.

6. The semiconductor device according to claim 1, wherein the hydrogen adjustment region is between a plurality of storage elements, and the plurality of storage elements includes the storage element.

7. The semiconductor device according to claim 1, wherein the hydrogen adjustment region surrounds an entire periphery of the storage element in a plane orthogonal to a direction from the first contact to the second contact.

8. The semiconductor device according to claim 1, further comprising:

a plurality of storage elements in each of a first region of the semiconductor device and a second region of the semiconductor device; and a plurality of hydrogen adjustment regions in each of the first region of the semiconductor device and the second region of the semiconductor device, wherein the plurality of storage elements in the first region comprises the storage element, the plurality of hydrogen adjustment regions in the first region comprises the hydrogen adjustment region, the plurality of storage elements in the first region and the plurality of storage elements in the second region have a first cross-section area and a first depth, the plurality of hydrogen adjustment regions in the first region have a second cross-section area and a second depth, the plurality of hydrogen adjustment regions in the second region have a third cross-section area and a third depth, the third cross-section area is larger than the second cross-section area, and the third depth is equal to or larger than the second depth.

* * * * *